United States Patent [19]
Schlig

[11] Patent Number: 5,457,415
[45] Date of Patent: Oct. 10, 1995

[54] CHARGE METERING SAMPLING CIRCUIT AND USE THEREOF IN TFT/LCD

[75] Inventor: Eugene S. Schlig, Somers, N.Y.

[73] Assignee: International Business Machines Corporation, Armonk, N.Y.

[21] Appl. No.: 968,698

[22] Filed: Oct. 30, 1992

[51] Int. Cl.[6] ........................ H03K 5/153; H03K 17/687
[52] U.S. Cl. .............................................. 327/94; 327/427
[58] Field of Search ................................. 327/91, 94, 427

[56] References Cited

U.S. PATENT DOCUMENTS

| | | | |
|---|---|---|---|
| 3,390,381 | 6/1968 | Shepard, Jr. | 365/149 |
| 4,308,468 | 12/1981 | Olson | 327/94 |
| 4,393,318 | 7/1983 | Takahashi et al. | 327/94 |
| 4,499,387 | 2/1985 | Konishi | 326/15 |
| 4,584,494 | 4/1986 | Arakawa et al. | 327/392 |
| 4,603,266 | 7/1986 | Berger | 327/94 |
| 4,694,341 | 9/1987 | Soneda et al. | 327/91 |
| 4,804,863 | 2/1989 | Welland et al. | 327/127 |
| 4,987,321 | 1/1991 | Toohey | 327/96 |
| 5,130,571 | 7/1992 | Carroll | 327/94 |
| 5,148,054 | 9/1992 | Demler | 327/91 |

Primary Examiner—Willis R. Wolfe, Jr.
Attorney, Agent, or Firm—David Aker

[57] ABSTRACT

A circuit for sampling monotonic input voltage changes and holding an output precisely derived from the sampled input change. The output change may be of the same polarity as the input, or inverted, and in the inverting mode of operation may exhibit highly accurate gain or attenuation. A single complementary metal-oxide-semiconductor (CMOS) embodiment may be configured to operate with positive or negative input changes and to present normal or inverted outputs, according to the application of various clock or control signals. Alternatively, subsets of that circuit provide subsets of the operating modes. The circuit operates by adding measured amounts of charge to, or removing it from a capacitor under the control of the input signal. Additional functional capabilities are capture and hold of input maximum or minimum, and accurate setting or restoration of the dc level of the output. Multiple stages may be cascaded, and the circuit may be designed for large bandwidth without introducing pedestal errors due to channel charge.

20 Claims, 4 Drawing Sheets

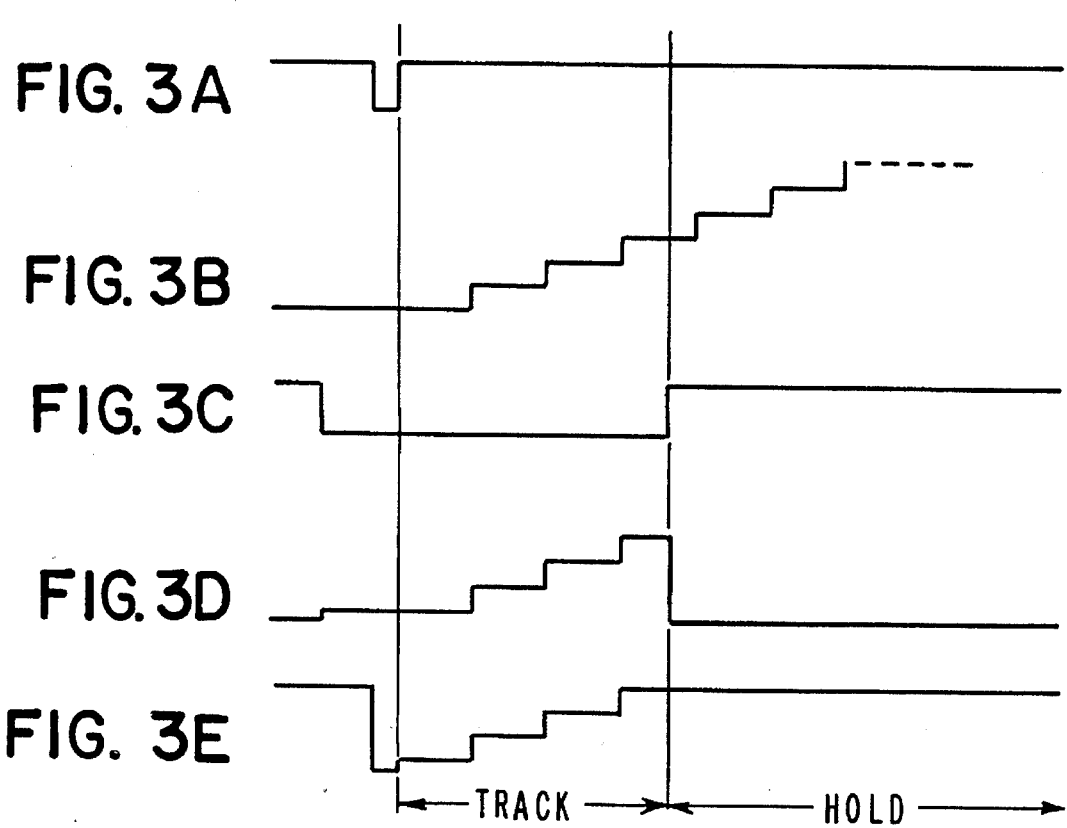
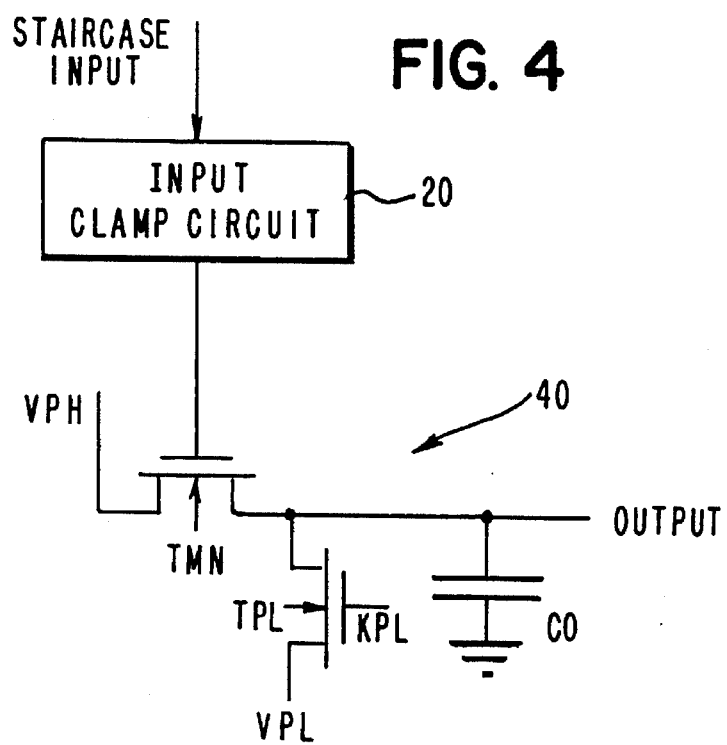

FIG. 5
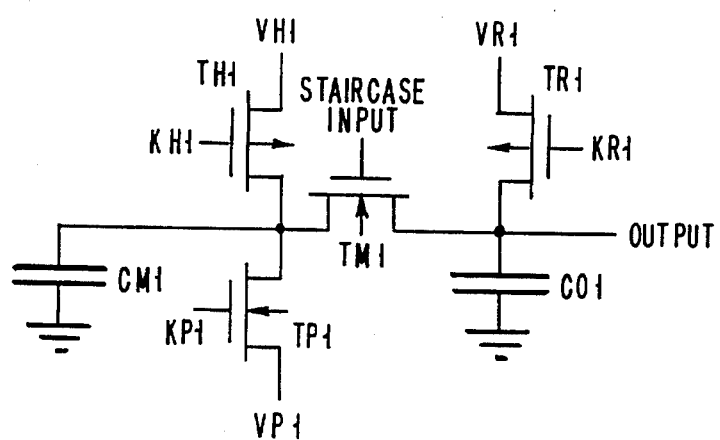
FIG. 6A STAIRCASE INPUT
FIG. 6B KP1
FIG. 6C KR1
FIG. 6D KH1
FIG. 6E OUTPUT
TRACK
HOLD

CHARGE METERING SAMPLING CIRCUIT AND USE THEREOF IN TFT/LCD

BACKGROUND OF THE INVENTION

1. Technical Field

This invention relates to voltage sampling circuits. More particularly, it relates to circuits which sample monotonic input voltage changes and hold an output precisely derived from an input voltage.

2. Background Art

Present day thin film transistor liquid crystal displays (TFT/LCD's) are limited in color rendition to about 4 bits (16 levels) per color. If these displays are to compete with CRT's in most application areas, 8-bit performance is needed. One of the key problems in achieving that goal is the economical designability of the data-line driver circuits. The stage of such circuits which most restricts the application range is the analog sample-and-hold or track-and-hold stage, which must capture an analog level corresponding to the intensity of each sub-pixel in one sub-pixel time and hold it for up to one line time. Some design relief may be obtained by dividing the display into segments operated in parallel. Nevertheless, existing methods and circuits are not promising for 8 bits per color in a large display.

Many methods of deriving the data line signals and applying them to the display data lines are in use or have been described in the literature. A first method which appears to be most extendable to the megapixel, 8-bit per color range is the "TV method" in which the analog video signal representing a line is sampled and held at each column in sequence at a time appropriate to the column. A second is the "ramp method" in which the digital data for a line is distributed to the column circuits and an analog voltage ramp representing the range of analog data is sampled and held at each column at the instant that the ramp voltage is equivalent to the digital word stored at that column.

The ramp method is the more extendable of the two because of two advantages which tend to reduce the required circuit bandwidth: First, in the design range addressed here there are fewer sampling intervals within a line time; 256 (corresponding to 256 analog levels) for the ramp method compared to 3000 (corresponding to 3000 sub-pixels per line) for the TV method. Second, the ramp voltage changes monotonically and gradually during the line time, while in the TV method the analog video can change abruptly and arbitrarily over the full dynamic range at any pixel time.

The ramp method may be improved by using a staircase waveform with discrete analog steps instead of a ramp so that performance is less influenced by errors due to time jitter, delay tolerances and propagation dispersion. In the preferred embodiments the present invention finds application in this staircase method.

FIG. 1 shows the commonly used MOS sampling switch 10 of the prior art in an NMOS implementation. It consists of NMOS field effect transistor 12 and a capacitor 14. Another commonly used sampling switch is CMOS, consisting of an NMOS and a PMOS device with sources and drains connected together respectively and with gates connected to complementary control signals. In the circuit of FIG. 1, the analog input to be sampled is applied to the source electrode 16 and a sample pulse is applied to the gate electrode 18 of the transistor. When the sample pulse is in a high state the output voltage across capacitor 14 charges to, and tracks, the analog input. When the sample pulse falls, the output voltage at that time is held on capacitor 14. It is advantageous to turn on the gate pulse at the beginning of the ramp and operate in the track mode, since the circuit bandwidth required is smaller.

While simple and economical, this circuit has certain limitations and drawbacks that are undesirable in some applications. Specifically, the output change is always non-inverted and equal to the input change; the output dc level of the output is the same as that of the input; the charging current for the capacitor comes from the analog input source, loading the input; and as a consequence multiple stages cannot be cascaded without charge sharing errors, unless buffer amplifiers are provided between stages. Finally, when the number of bits and the number of pixels are large, the sampling window becomes short and the accuracy required of the capacitor voltage becomes large. This leads to a large channel width for the switch and a small value of capacitance. In this type of sample and hold, there is inherently a considerable amount of charge stored in the switch channel at the instant before the gate pulse falls because the source and drain voltages are virtually equal and the gate-to-source/drain voltage is above threshold. At the fall of the gate pulse much of this charge is transferred to the capacitor where it creates a data-dependent "pedestal error" which is large because of the wide channel and small capacitor. At the same time, the tolerance of the system to pedestal error is small because of the large number of bits. (A second source of pedestal error is the gate to source stray capacitance, but with modern self-aligned technologies this can be negligible.) In commercial sample-hold circuits this error is avoided by complex techniques employing operational amplifiers, which are too complex and space-consuming for this application. Partial fixes are also known, but are both complex and inadequate.

SUMMARY OF THE INVENTION

It is a principal object of this invention to provide a sampling circuit having a general relationship between input and output and which can alter that relationship under the control of applied signals.

It is another object of the invention to provide a sampling circuit which does not derive output charging current from the analog input source.

It is still another object of the invention to provide a sampling circuit which may be cascaded with additional stages of the circuit of the invention without buffer amplifiers.

It is still another object of the invention to provide a sampling circuit which may be designed for high precision at high bandwidths without the use of dummy switches or operational amplifiers.

It is a further object of the invention to provide a sampling circuit which permits the capture and hold of input an maximum or minimum.

It is an additional object of the invention to provide a sampling circuit which permits accurate setting or restoration of the dc level of the output, thus permitting the elimination of dc level errors such as those caused by the variability of MOS device thresholds.

The circuit of the invention, in a preferred embodiment, is fabricated as a complementary metal-oxide-semiconductor (CMOS) integrated circuit comprising P- and N-channel field effect transistors and capacitors which share a common electrode (such as the substrate). In accordance with the invention, the circuit operates by charge metering, by which is meant transferring precise amounts of electric charge to and from at least one capacitor under the control of the input. The circuit may be configured by the application of clock or control signals to operate in any of four modes; to track either positive or negative monotonic input changes and to present normal or inverted outputs. In operation in the noninverting modes, a capacitor is initially precharged under clock pulse control to a voltage corresponding to an initial input level. Responsive to an input change on the gate of a metering transistor, a measured amount of charge is removed from the capacitor. The capacitor voltage change is the output. In the inverting modes, a second capacitor is precharged as above and the firs capacitor is then set to a precise initial voltage level. Responsive to the input change on the metering transistor gate, a measured amount of charge is transferred from the first to the second capacitor. The voltage change of the second capacitor is the output. With N-channel metering transistors the output will be responsive to increasing input voltage while P-channel will make it responsive to decreasing input voltage. The circuit may be configured with both, the active one being determined either by their separate inputs or, with common input, by the state of a mode control signal. The output in each mode is held at its value when the input reverses direction of change (peak hold) or, in the inverting modes, when the second capacitor is discharged under clock control. Two significant features of the invention are that multiple stages may be cascaded without buffer amplifiers and that pedestal errors due to injection of channel charge into the output are avoided.

BRIEF DESCRIPTION OF THE DRAWINGS

FIG. 3A to FIG. 3E are timing diagrams for the waveforms associated with the circuit of FIG. 2.

FIG. 4 is a schematic diagram of an embodiment of the invention which is slightly more general than that of FIG. 2.

FIG. 5 is a schematic diagram of a single mode, inverting embodiment of the invention.

FIG. 6A to FIG. 6E are timing diagrams for the waveforms associated with the circuit of FIG. 5.

DETAILED DESCRIPTION OF THE PREFERRED EMBODIMENTS

Figure 2:
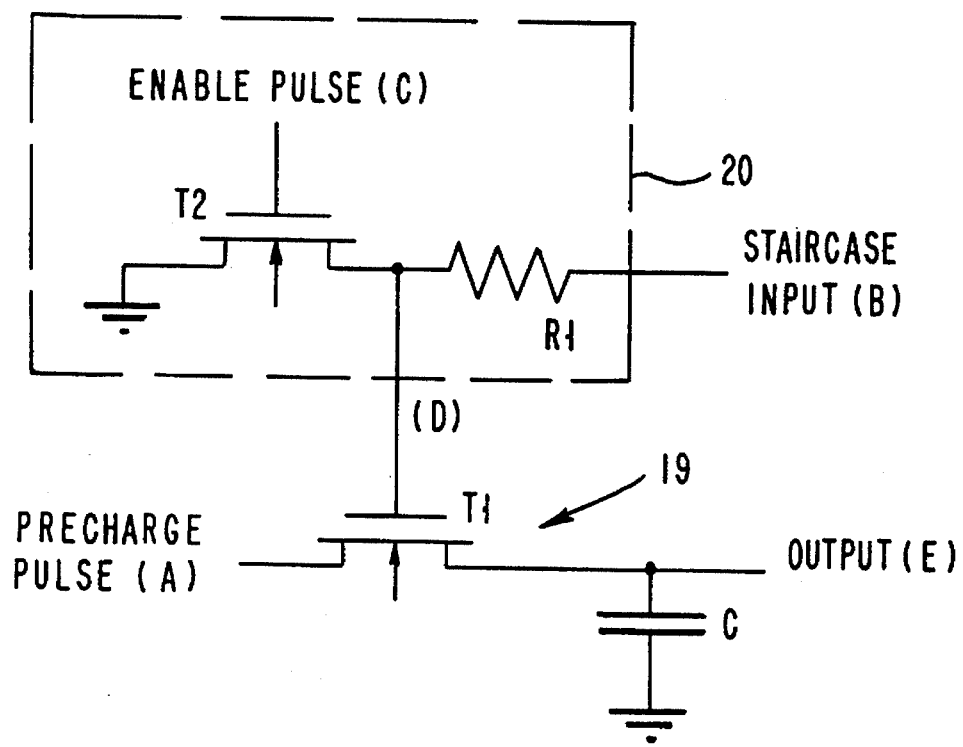
FIG. 2 is a schematic diagram of a simple single-mode, noninverting embodiment of the invention.

The present invention, as shown in the simplest single-mode noninverting embodiment for increasing inputs as circuit 19 in FIG. 2, and with a timing diagram as shown in FIG. 3A to FIG. 3E, uses a new track and hold scheme in which the charge stored in the switch channel when the gate signal falls is negligible, and thus the pedestal error is negligible. The invention is shown herein terms of NMOS technology (or the NMOS component of CMOS technology), but others are applicable.

At the beginning of a line cycle on an LCD, enable pulse (FIG. 3C) is initially low so clamping transistor T2 is off. The base step of the staircase (FIG. 3B) is applied to the gate of charge metering transistor T1 through resistor R1. A negative-going precharge pulse is applied to the source of T1 at node A. T1 conducts, charging storage capacitor C to a low voltage. (FIG. 3A). After the precharge pulse, the storage capacitor C discharges through T1 to a potential equal to the that of the channel in the semiconductor beneath the gate of T1. That potential is governed by the base step of the applied staircase waveform at node B (FIG. 3B). As the staircase steps positively, the gate voltage D (FIG. 3D) follows it as long as the enable pulse at C (FIG. 3C) is down. The channel potential follows the gate potential, and the capacitor voltage E (FIG. 3E) follows the channel potential by means of conduction of excess capacitor charge through the channel to the source. This is the track mode. The capacitor voltage is the output. At the time when the staircase amplitude reaches the value determined by the stored digital word, a gating circuit (not shown) causes the enable pulse C to rise, turning on NMOS transistor T2 and causing the gate voltage of T1 to become independent of the staircase waveform and to drop in voltage. This reduces the channel potential of T1 and isolates the storage capacitor, causing the final value of capacitor voltage to be held.

This is the hold mode. At the instant before the drop in gate voltage the source voltage is larger than the drain voltage so that the drain is acting as the effective source, and the gate-to-effective-source voltage is virtually equal to the threshold. Thus virtually no charge is stored in the channel at the time of the switch to the hold mode, so virtually no pedestal error is induced. The held voltage on the capacitor represents the next voltage to be applied to the display data line.

Transistor T2 and resistor R1 comprise an input clamping switch 20 which connects node D either to the staircase or to a low voltage (ground, for instance) depending upon the state of the enable pulse. Other devices may be substituted for R1, such as an NMOS active load, an NMOS device driven by the complement of the enable pulse, or a PMOS device also driven by the enable pulse.

Figure 1:
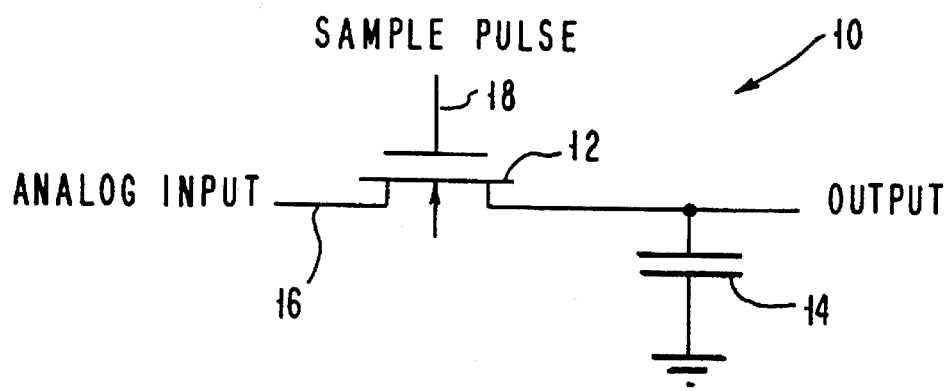
FIG. 1 is a schematic diagram of a prior art NMOS sample and hold circuit.

The following differences exist between the track and hold of the invention as illustrated in FIG. 2, and that of the prior art as illustrated in FIG. 1. In the prior art the analog ramp is applied to the source electrode of the switch, while in the invention to a precharge pulse is applied to the source. In the prior art a track/hold pulse is applied to the gate electrode of the switch, while in the invention the analog staircase is applied to the gate electrode until, at the start of the hold mode, the gate electrode is switched low.

A second embodiment of the invention for the same mode as FIG. 2 is illustrated in circuit 40 of FIG. 4. A positive-going precharge pulse KPL is applied to the gate of an added precharging transistor, NMOS transistor TPL, which is connected between the output terminal and a low voltage supply VPL. The source of metering transistor TMN is connected to a high voltage supply VPH. Storage capacitor CO is connected the same way and input clamping circuit 20 is the same as for the embodiment of FIG. 2. The waveforms of the circuit of FIG. 4 are the same as FIG. 3 except that the precharge pulse is the inverse of that of FIG. 3A. The advantage of FIG. 4 is that the precharge pulse source is not loaded by the charging currents of capacitor CO.

FIG. 5 shows an embodiment of the invention which operates in the inverting mode with positive input changes. FIGS. 6A to 6B show a timing diagram for the waveforms of the circuit of FIG. 5. In this example, the full staircase input waveform is shown in FIG. 6A rather than a portion as in FIG. 3B. A nonlinear "reversed S-shaped" staircase is shown, which is typical of LCD practice. Since the staircase typically has a large number of steps, for instance 255 steps, the individual steps are not shown.

At the start of the operating cycle, the staircase is at its base step. A positive-going precharge pulse is applied as the gate input KP1 to NMOS precharging transistor TP1 (FIG. 6B). TP1 turns on during the pulse, charging metering capacitor CM1 to a low voltage from supply VP1. Storage capacitor CO1 also receives charge through metering transistor TM1, bringing the output to a lower voltage (FIG. 6E). Next, a negative-going pulse is applied as the gate input KR1 to PMOS reference setting transistor TR1 (FIG. 6C), turning it on, Capacitor CO1 is charged to a high initial voltage from supply VR1, and while KR1 is low excess negative charge from capacitor CM1 spills through TM1 and is absorbed by supply VR1. When the KR1 pulse ends, turning TR1 off, the voltage across CM1 is equal to the channel potential of transistor TM1. As the staircase rises in voltage the channel potential of transistor TM1 increases correspondingly, causing negative charge to be spilled from CM1, through TM1, to collect in CO1 reducing the output voltage. The gain of the circuit is the ratio of output voltage change to staircase voltage change, which is approximately $-CM1/CO1$ (track mode).

The gate input voltage KH1 to PMOS transistor TH1, in the high state until now, switches to the low state at the time that the staircase voltage corresponds to the input digital word (FIG. 6D). TH1 turns on, charging CM1 to a high voltage from supply VH1. This high source voltage turns off TM1 so the output is no longer responsive to the staircase voltage change (hold mode). This use of transistor TH1 to initiate the hold mode in an inverting circuit makes an input clamp circuit unnecessary. At the end of a cycle the staircase returns to its base step and KH1 returns to the high state.

Figure 7:
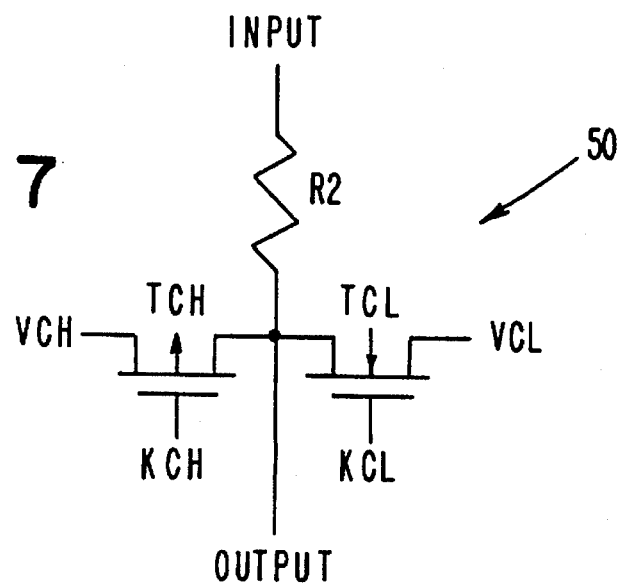
FIG. 7 is a schematic diagram of an example of an input clamp circuit for use with the invention.

FIG. 7 shows an example of a more general input clamp circuit 50 for use with the invention, particularly in noninverting modes, to establish the output hold state. Whereas input clamp circuit 20 of FIG. 2 is used to clamp to a low voltage, that of FIG. 7 may be used to clamp to either a low or a high voltage, depending on the states of input control signals. Two clamping transistors, transistor TCH and transistor TCL are provided with gate input control signals KCH and KCL respectively. In this example transistor TCH is P-channel and transistor TCL is N-channel. When KCH is high and KCL is low, both transistors are off and the input is passed through resistor R2 to the output, which becomes the input to a circuit such as 60 of FIG. 8. If KCH falls, transistor TCH turns on and clamps the output to a high potential near VCH regardless of the input. If KCL rises, transistor TCL turns on and clamps the output to a low potential near VCL. Both transistors are not turned on simultaneously. Clamping to a low potential is suitable for modes using an NMOS metering transistor, while clamping to a high potential is suitable for those using a PMOS metering transistor. If only high clamping or only low clamping is required, the circuit may be correspondingly simplified, for instance as shown as circuit 20 of FIG. 2.

Figure 8:
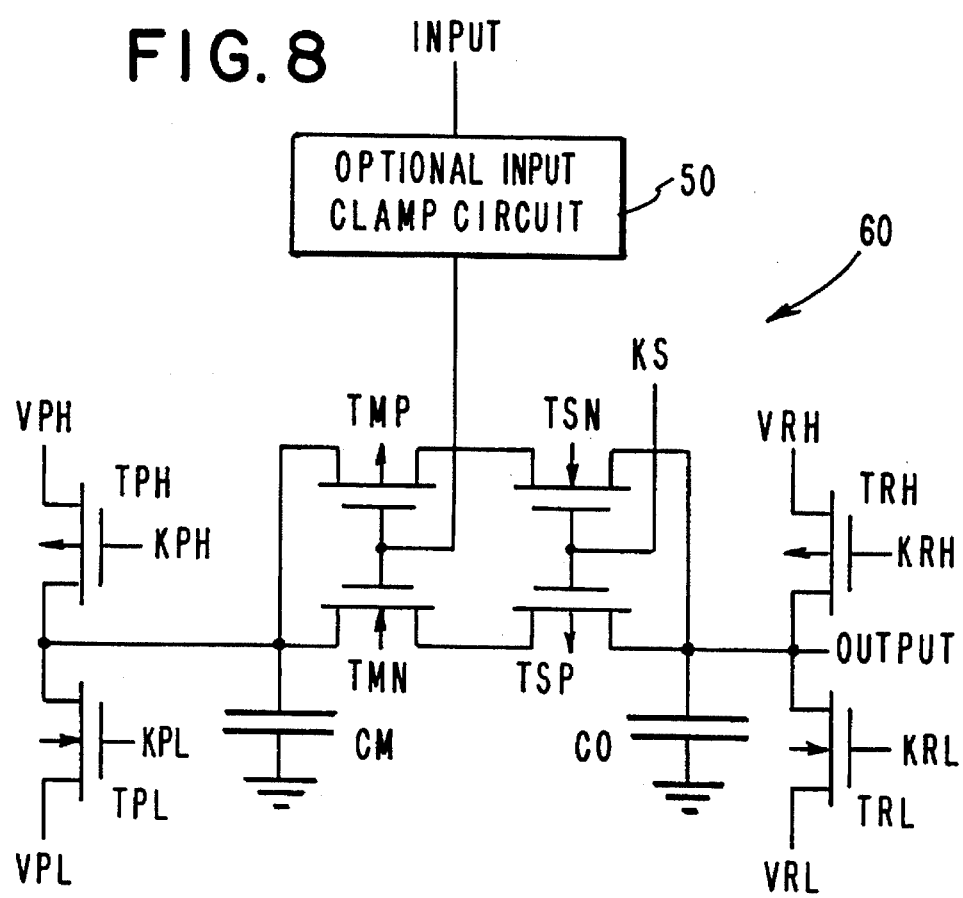
FIG. 8 is a schematic diagram of a general four-mode CMOS preferred embodiment of the invention.

Referring to FIG. 8, the present invention is shown in a CMOS preferred embodiment in one of its most generally applicable forms, including the optional input clamping circuit 50 of FIG. 7. The general circuit 60 of FIG. 8 consists of eight MOS transistors and two capacitors. Still more generality may be obtained by, for example, providing separate input connections to metering transistors transistor TMP and transistor TMN, and to mode switching transistors TSP and TSN. The various functions are determined, sequenced and timed by means of the application of the input signal and clock or control signals KS, KPH, KPL, KRH and KRL. The functions the circuit 60 of FIG. 8 can perform are listed below:

1. Amplify, follow or attenuate an input voltage change of either polarity with inversion, or follow an input voltage change of either polarity without inversion.
2. Sample and hold input voltage changes of either polarity.
3. Track and hold monotonically changing inputs.
4. Capture and hold input maxima or minima.
5. Set or restore the dc level of the output without the need for a series capacitor.
6. Eliminate variability of input dc level, such as that due to device threshold voltage dependence.

For track or sample and hold operation, clamping circuit 50 of FIG. 5, may be used to initiate the hold state. It is generally not needed for the inverting modes of operation. Depending upon the specific application, some of the components, clock signals and voltage sources may often be eliminated, providing a subset of the full range of capability. The circuits of FIG. 2, FIG. 4 and FIG. 5 are such subsets. Additionally, many of the components may be replaced by others than those shown in the figure as a matter of engineering choice. In the figures, N-channel transistors are identified by arrows directed toward the symbol and P-channel transistors by arrows directed away. Transistors TMP and TMN must be complementary types, as shown, to respond to decreasing and increasing inputs respectively, and transistors TSP and TSN must be complementary if they are to function as a mode switch with a common input. The specific types for transistors TPH, TPL, TRH, TRL (and transistors TCL and TCH of FIG. 5) are chosen to minimize required clock pulse amplitudes and voltage levels. The choice of device type determine the amplitude and polarity required of the applied control signals.

Circuit 60 of FIG. 8 has four operating modes which depend upon the specific control signals applied. These include noninverting, positive output changes; noninverting, negative output changes; inverting, negative output changes; and inverting, positive output changes.

One example of an application for a multimode embodiment of the invention is periodic inversion of the signal applied to a data line of an LCD.

In brief, the inverting modes operate by addition of charge to capacitor CO and the noninverting modes operate by subtracting charge from capacitor CO. The normal output in all modes is the voltage change across capacitor CO. When the circuit operates in an inverting mode, a unity gain noninverted output is also available as the voltage across capacitor CM. Capacitor CM is required only for the inverting modes. Transistors TPH and TPL comprise the precharging switch. They are used individually to precharge capacitors CM and CO to VPH or VPL (depending upon the mode), to initiate the hold state in the inverting modes, and to drain charge spilled from capacitor CO in the noninverting modes.

In an embodiment using only noninverting modes, the precharging switch may be located remotely from the circuit and may be shared by a number of circuits which have identical modes of operation and precharge timing. The circuit of FIG. 2 is an example. A shared precharging switch must be designed to drive the total capacitive load of all circuits that share it. In the case of exclusively noninverting operation with a complementary pair of precharging switch transistors as shown in FIG. 8, the transistors may have their gates connected together and share a common control signal. For exclusively noninverting operation, the complementary precharging switch of FIG. 8 may be replaced by a switch using a single PMOS or NMOS transistor with an active or passive load in place of the second transistor.

Another option for versions using a subset of the modes of operation is to connect the transistor which precharges capacitors CM and CO to the top terminal of capacitor CO instead of to that of capacitor CM. This has advantages and disadvantages depending on the mode of operation. In the particular case of noninverting operation in a single mode, this connection of a non-shared precharging switch permits the elimination of one of the devices of the precharging switch as shown in FIG. 4 for the example of the noninverting, positive output change mode. For the noninverting, negative output change mode, VPL and VPH would be interchanged, and transistor TPH with gate pulse KPH would replace TPL and KPL.

Transistors TRH and TRL comprise the reference setting switch which in the inverting modes sets the initial output to VRH or VRL, depending on the mode. The reference setting switch, together with the associated control signals and voltage sources, is required only for the inverting modes.

Transistors TMP and TMN comprise the charge metering switch which performs the input functions. Transistor TMP is used for negative-going input changes and transistor TMN for positive-going changes. Both are required only if both input types are used. The metering switch transistors may be configured as tetrode devices, with a second gate between the gate and drain connected to a fixed potential. This reduces the dependence of the channel potential upon the drain voltage.

Since the input to the circuit is applied to the gate of the metering transistors, the previous circuit which drives the input is not loaded by the operation of the circuit. Thus, multiple stages may be cascaded without buffer amplifiers.

Transistor TSP and TSN comprise the mode setting switch which helps establish the particular mode of operation. By providing them with separate gate inputs they can also function as an output latch, isolating the output from the input. When used only as a mode switch, they are required only when the circuit incorporates a complementary pair of metering transistors having a common input. When an output latch is used, input clamp circuit 50 is generally not needed.

In the following detailed descriptions of the four operating modes of the circuit of FIG. 8, the influence of transistor body effect is neglected in the interest of clarity. In each mode, transistor body effect in the metering switch acts to reduce the gain slightly. The circuit technology used may be optimized in known ways to minimize body effect, and in the inverting modes the ratio of CM to CO may be adjusted to compensate for it.

OPERATION IN THE NONINVERTING, POSITIVE OUTPUT CHANGE MODE

KRH is kept high and KRL is kept low so that the reference setting switch remains off. KS is kept low enough in potential so TSP is on and TSN is off over the entire operating voltage range, thus enabling transistor TMN and disabling transistor TMP. If the metering switch has two independent inputs and the mode switch is absent, the input to transistor TMP is kept high enough in potential to disable it. Initially, assume that KPH is high and KPL is low so that the precharging switch is off. With the input at its initial low level (at least a threshold above VPL), KPL rises to precharge capacitors CM and CO to VPL through transistors TPL, TMN and TSP. KPL falls and then KPH falls, charging CM positively to VPH. KPH remains low. Capacitor CO spills negative charge through transistors TMN and TSP until the output voltage equilibrates with the channel potential of transistor TMN at a level below the input voltage by the transistor TMN threshold voltage. Any positive change in the input spills more charge from CO so the output tracks the input. Spilled charge is absorbed by the VPH supply. The output remains fixed for any negative input change, so the output holds positive peaks.

The input may be pulled to a low potential by an input clamp circuit to initiate the output hold state. In contrast to the case of the prior art sampling switch of FIG. 1, the channel charge in transistor TMN is very small when the input drops, so pedestal errors due to channel charge are avoided.

If transistors TSN and TSP are provided with separate gate inputs, the hold mode may also be initiated by turning both transistors off, provided that resulting pedestal errors are tolerable. The output voltage dynamic range is bounded by VPL and VPH.

OPERATION IN THE NONINVERTING, NEGATIVE OUTPUT CHANGE MODE

In this mode KRH is kept high and KRL is kept low so the reference setting switch remains off. KS is kept high so TSN is on and TSP is off over the entire operating voltage range, thus enabling transistor TMP and disabling transistor TMN. If the metering switch has two independent inputs and the mode switch is absent, the input to transistor TMN is kept low enough in potential to disable it. Initially, assume that KPH is high and KPL is low so the precharging switch is off. With the input at its initial high level (at least a threshold below VPH), KPH falls to precharge capacitors CM and CO to VPH through transistors TPH, TMP and TSN. KPH rises and then KPL rises, charging capacitor CM negatively to VPL. KPL remains high. Capacitor CO spills positive charge (in principle) through transistors TMP and TSN until the output voltage equilibrates with the channel potential of transistor TMP at a level above the input voltage by the threshold voltage of transistor TMP. Any negative change in the input spills more charge from capacitor CO. The output therefore tracks the input. Spilled charge is absorbed by the VPL supply. The output remains fixed for any positive input change. The output therefore holds negative peaks.

The input may be pulled to a high potential by an input clamp circuit to initiate the output hold state. In contrast to the case of the prior art sampling switch of FIG. 1, the channel charge in transistor TMP is very small when the input rises. Thus, pedestal errors due to channel charge are avoided.

If transistors TSN and TSP are provided with separate gate inputs, the hold mode may be established by turning both off, provided that resulting pedestal errors are tolerable. The output voltage dynamic range is bounded by VPL and VPH.

OPERATION IN THE INVERTING, NEGATIVE OUTPUT CHANGE MODE

Initially KRL is low and KRH is high and the reference switch is off. KS is kept low enough so that transistor TSP is on and transistor TSN is off over the entire operating voltage range, thus enabling transistor TMN and disabling transistor TMP. If the metering switch has two independent inputs and the mode switch is absent, the input to transistor TMP is kept high enough in potential to disable it. Initially, assume that KPH is high and KPL is low so the precharging switch is off. With the input at its initial low level (at least a threshold above VPL), KPL rises to precharge capacitor CM and capacitor CO to VPL through transistors TPL, TMN and TSP. KPL falls, turning off the precharging switch. KRH then falls, charging capacitor CO to VRH, thus setting the initial output level independently of the input and device thresholds. Capacitor CM spills negative charge through transistors TMN and TSP until its voltage equilibrates with the channel potential of transistor TMN at a threshold below the input voltage. The spilled charge is absorbed by the VRH supply, KRH then rises, shutting off the reference setting switch. Any positive change in the input spills more charge from capacitor CM which is collected by capacitor CO, changing the output voltage negatively. The gain is approximately −CM/CO. The output remains fixed for any negative input change, so the output holds values corresponding to positive input peaks.

The output hold state may be initialized by pulling down the input, but in this inverting mode it is usually preferable to do so by switching KPH to its low state, turning on transistor TPH and charging capacitor CM to VPH, so that no further charge may be transferred from capacitor CM to capacitor CO. In contrast to the case of the prior art sampling switch of FIG. 1, the channel charge in transistor TMN is very small when the hold mode begins. Thus, pedestal errors due to channel charge are avoided. In fact, injection of any residual channel charge tends to improve accuracy in the inverting modes.

If transistors TSN and TSP are provided with separate gate inputs, the hold mode may also be initiated by turning off, provided that resulting pedestal errors are tolerable. The output voltage dynamic range is bounded by VRH at the top and by the maximum input voltage less the threshold voltage of transistor TMN at the bottom.

OPERATION IN THE INVERTING, POSITIVE OUTPUT CHANGE MODE

Initially KRL is low and KRH is high so the reference switch is off. KS is kept high enough so that transistor TSN is on and transistor TSP is off over the entire operating voltage range, thus enabling transistor TMP and disabling transistor TMN. If the metering switch has two independent inputs and the mode switch is absent, the input to transistor TMN is kept low enough in potential to disable it. Initially, assume that KPH is high and KPL is low so the precharging switch is off. With the input at its initial high level (at least a threshold below VPH), KPH falls to precharge capacitors CM and CO to VPH through transistors TPH, TMP and TSN. KPH rises, turning off the precharging switch. KRL then rises, charging capacitor CO to VRL, thus setting the initial output level independently of the input and device thresholds. Capacitor CM spills positive charge (in principle) through transistors TMP and TSN until its voltage equilibrates with the channel potential of transistors TMP at a threshold above the input voltage. The spilled charge is absorbed by the VRL supply. KRL then falls, shutting off the reference setting switch. Any negative change in the input spills more charge from capacitor CM which is collected by capacitor CO, changing the output voltage positively. The gain is approximately −CM/CO. The output remains fixed for any positive input change, so the output holds values corresponding to negative input peaks. The output hold state may be initiated by pulling up the input, but in this inverting mode it is usually preferable to do so by switching KPL to its high state, turning on transistor TPL and charging capacitor CM to VPL, so that no further charge may be transferred from capacitor CM to capacitor CO. In contrast to the case of the prior art sampling switch of FIG. 1, the channel charge in transistor TMP is very small when the hold mode begins. Thus, pedestal errors due to channel charge are avoided. In fact, injection of any residual channel charge tends to improve accuracy in the inverting modes.

If transistors TSN and TSP are provided with separate gate inputs, the hold mode may also be initiated by turning both off, provided that resulting pedestal errors are tolerable. The output voltage dynamic range is bounded by VRL at the bottom and by the minimum input voltage plus the threshold voltage of transistor TMP at the top.

While this invention has been described in connection with the preferred embodiments, it will be understood that those with skill in the art may be able to develope variations of the disclosed embodiment without departing from the spirit of the invention or the scope of the following claims:

I claim:

1. A track and hold circuit for a monotonically varying input signal comprising:

a first FET having a source, a gate and a drain;

a sampling capacitor connected between one of said source and said drain and a reference;

supply means for supplying a precharging signal to the other of said source and said drain; and connecting means for sequentially connecting one of an input signal and a hold signal to said gate of said first FET.

2. The circuit of claim 1 wherein said connecting means comprises a second FET for applying a hold signal to said gate of said first FET.

3. The circuit of claim 1 wherein said connecting means comprises a coupling component for coupling the input signal to said gate of said first FET.

4. A track and hold circuit for a monotonically varying input signal comprising:

a first FET having a source, a gate and a drain;

a sampling capacitor connected between one of said source and said drain and a reference;

means for supplying a voltage to the other of said source and said drain; and means for sequentially connecting one of said input signal and a hold signal to said gate of said first FET.

5. The circuit of claim 4 wherein said connecting means comprises a second FET for applying a hold signal to said gate of said first FET.

6. The circuit of claim 4 wherein said connecting means comprises a coupling component for coupling the input signal to said gate of said first FET.

7. The circuit of claim 4 further comprising precharging means for precharging said sampling capacitor prior to application of said input signal.

8. The circuit of claim 7 wherein said precharging means comprises a second FET connected to a supply voltage, and means for momentarily causing said FET to conduct charge to said sampling capacitor.

9. A track and hold circuit for a monotonically varying input comprising:

a first metering transistor for responding to a positive going input signal;

a second metering transistor for responding to a negative going input signal;

mode switching means for selecting for operation one of said first metering transistor and said second metering transistor;

a sampling capacitor having a first side coupled to said first metering transistor and said second metering transistor by way of said mode switching means and a second side connected to a circuit reference potential; and precharging means for precharging said sampling capacitor by way of one of said metering transistors and by way of said mode switching means.

10. The circuit of claim 9 wherein said precharging means comprises:

a first precharging transistor for charging said sampling capacitor to a first voltage, and a second precharging transistor for charging said sampling capacitor to a second voltage; said first voltage being higher than said second voltage.

11. The circuit of claim 9 further comprising a clamping means for clamping said input at one or more predetermined voltages.

12. The circuit of claim 9 further comprising:

a reference setting means for applying an initial voltage to said sampling capacitor; and a second sampling capacitor having a first side connected between a side of said metering transistors opposite to that connected to said mode switching means; said second sampling capacitor having a second side connected to said circuit reference potential.

13. The circuit of claim 12 wherein said reference setting means comprises:

a first transistor for connecting said first sampling capacitor to a first initial voltage; and a second transistor for connecting said first sampling capacitor to a second initial voltage; said first voltage being higher than said second voltage.

14. The circuit of claim 9 wherein said mode switching means comprises a first mode transistor and a second mode transistor, said second mode transistor being a complement of said first mode transistor.

15. The circuit of claim 14 further comprising means for rendering both said first mode transistor and said second mode transistor nonconducting so that said sampling capacitor holds a sample of said input.

16. The circuit of claim 14 where said first mode transistor has a first gate and said second mode transistor has a second gate, and a mode is selected by enabling one of said first gate and said second gate.

17. The circuit of claim 16 wherein said first gate and said second gate are electrically connected to one another.

18. A track and hold circuit for a monotonically varying input comprising:

a first FET having a source, a gate and a drain;

a capacitor coupled between one of said source and said drain of said first FET and a reference;

a second capacitor coupled between a second of said source and said drain and said reference;

means for precharging said second capacitor to said reference;

means for precharging said first capacitor to a fixed initial voltage other than said reference;

means for applying an input signal to said gate of said first FET; and biasing means for biasing said first FET so as to isolate said first capacitor from said second capacitor and from said input signal.

19. The circuit of claim 18 in which said biasing means comprises a second FET for causing said one of said source and drain connected to said second capacitor to assume a fixed voltage other than said reference.

20. The circuit of claim 18 wherein said biasing means comprises means for biasing said gate so as to isolate said first capacitor from said second capacitor and from said input signal.

* * * * *